(12) United States Patent
Shoki et al.

(10) Patent No.: US 6,749,973 B2
(45) Date of Patent: Jun. 15, 2004

(54) REFLECTION TYPE MASK BLANK FOR EUV EXPOSURE AND REFLECTION TYPE MASK FOR EUV EXPOSURE AS WELL AS METHOD OF PRODUCING THE MASK

(75) Inventors: Tsutomu Shoki, Tama (JP); Morio Hosoya, Tokyo (JP)

(73) Assignee: Hoya Corporation, Tokyo (JP)

( * ) Notice: Subject to any disclaimer, the term of this patent is extended or adjusted under 35 U.S.C. 154(b) by 149 days.

(21) Appl. No.: 10/073,874

(22) Filed: Feb. 14, 2002

(65) Prior Publication Data

US 2002/0110743 A1 Aug. 15, 2002

(30) Foreign Application Priority Data

Feb. 14, 2001 (JP) ........................................ 2001-037034

(51) Int. Cl.⁷ ................................................ G03F 9/00
(52) U.S. Cl. ........................................................ 430/5
(58) Field of Search ............................ 430/5, 322, 323; 378/35

(56) References Cited

U.S. PATENT DOCUMENTS 6,352,803 B1 * 3/2002 Tong et al. ..................... 430/5
6,596,465 B1 * 7/2003 Mangat et al. ............... 430/311

FOREIGN PATENT DOCUMENTS

| JP | 7-333829 A | 12/1995 |
| JP | 8-213303 A | 8/1996 |

* cited by examiner

Primary Examiner—S. Rosasco
(74) Attorney, Agent, or Firm—Sughrue Mion, PLLC

(57) ABSTRACT

In a reflection type mask blank for EUV exposure, a multilayer film is formed on a substrate to reflect EUV light. An intermediate layer is formed on the multilayer film. An absorber layer is formed on the intermediate layer to absorb the EUV light. The intermediate layer is formed by a material containing Cr and at least one element selected from the group consisting of N, O, and C.

11 Claims, 3 Drawing Sheets

REFLECTION TYPE MASK BLANK FOR EUV EXPOSURE AND REFLECTION TYPE MASK FOR EUV EXPOSURE AS WELL AS METHOD OF PRODUCING THE MASK

BACKGROUND OF THE INVENTION

This invention broadly relates to an exposure technique used in a semiconductor process and, in particular, to a reflection type mask blank for EUV (Extreme Ultra Violet) exposure, a reflection type mask for EUV exposure, and a method of producing the same as well as a method of producing a semiconductor device using the same.

It is noted here that EUV light, which is described in the present specification, is a radiation having a wavelength within a soft X-ray region or a vacuum ultraviolet region, specifically, a wavelength within a range between about 0.2 and 100 nm.

In the semiconductor industry, an integrated circuit comprising fine patterns is formed on an Si substrate by the use of a pattern transfer technique. As the pattern transfer technique, use has typically been made of photolithography utilizing visible light or ultraviolet light. Following accelerated development of a semiconductor device having finer patterns, a shorter wavelength is required as an exposure wavelength to achieve higher resolution. On the other hand, limitation is imposed upon achievement of such shorter wavelength in existing optical exposure using the above-mentioned photolithography so that the limit of resolution is approaching.

In case of the photolithography, it is known that a pattern resolution limit is generally a half of the exposure wavelength. Even if an $F_2$ laser beam having a wavelength of 157 nm is employed, it is predicted that the resolution limit is on the order of 70 nm. As an exposure technique capable of achieving the resolution beyond 70 nm, an EUV lithography (will be abbreviated to EUVL hereinafter) using EUV light is promising because the EUV light has a wavelength of 13 nm, much shorter than that of the $F_2$ laser beam. The EUVL is similar to the photolithography in respect of the principle of image formation. For the EUV light, however, all substances exhibit high absorption and a refractive index is substantially equal to 1. Consequently, in the EUVL, a refraction optical system used in the photolithography can not be employed and, instead, a reflection optical system is exclusively used.

As a mask used in the EUVL, a transmission type mask with a membrane has been suggested recently. However, the transmission type mask is disadvantageous in that sufficient throughput can not be assured because the membrane exhibits high absorption for the EUV light and consequently an exposure time becomes long. Under the circumstances, a reflection type mask for exposure is generally used at present.

Referring to FIG. 1, description will briefly be made of first through third existing techniques for obtaining the above-mentioned reflection type mask for EUV exposure. Then, description will proceed to the necessity of an etching stopper used in a production process of the reflection type mask.

(First Existing Technique)

The production process for obtaining the reflection type mask for EUV exposure includes (1) a substrate preparation step of preparing a substrate, (2) a deposition step of depositing a multilayer film onto the substrate, (3) a deposition step of depositing an intermediate layer, (4) a deposition step of depositing an absorber layer, (5) an EB (Electron Beam) resist application step of applying an EB resist, (6) an EB resist writing step, (7) a dry-etching step, and (8) a removing step of removing the intermediate layer. Each of the above-mentioned steps will be explained hereinafter.

(1) Substrate Preparation Step:

Preferably, the substrate 11 has a low coefficient of thermal expansion and is superior in smoothness, flatness, and resistance to a cleaning method used for cleaning the EUV mask. As the substrate 11, a glass having a low coefficient of thermal expansion is generally used.

(2) Multilayer Film Deposition Step:

The multilayer film 12 contains Mo and Si in many cases. For example, a single-period thickness is assumed to be 28 Å and 42 Å for Mo and Si, respectively. Then, by forming a laminate structure of at least 30 periods, it is possible to realize the multilayer film which reflects the EUV light having a peak wavelength of 13.4 nm. In case of the multilayer film containing Mo and Si, a Si film is deposited as a topmost layer.

(3) Intermediate Layer Deposition Step:

On the multilayer film 12 for reflecting the EUV light, an $SiO_2$ film is deposited as the etching stopper constituting the intermediate layer. For example, the deposition may be carried out by RF magnetron sputtering using an $SiO_2$ target.

(4) Absorber Layer Deposition Step:

The absorber layer 14 for absorbing the EUV light is deposited by sputtering. As a deposition material, Ta or Cr may be used. For example, the deposition may be carried out by DC magnetron sputtering. By this step, an EUV mask blank is obtained.

(5) EB Resist Application Step:

By forming a resist pattern on the absorber layer 14 of the EUV mask blank thus obtained, the EUV mask can be produced. The EB resist is applied on the EUV mask blank obtained in the step (4), and is baked at 200° C.

(6) EB Resist Writing Step:

On the EUV mask blank with the EB resist applied thereon, the resist pattern is formed by the use of an EB writing machine.

(7) Dry-Etching Step:

With the above-mentioned resist pattern used as a mask, the EUV absorber layer 14 is dry-etched with chlorine to thereby form a pattern on the absorber layer.

(8) Intermediate Layer Removing Step:

The intermediate layer remaining on an EUV reflection surface, namely, the etching stopper 23 comprising the $SiO_2$ film is removed with a dilute HF solution. Thus, the reflection type mask for EUV exposure is completed.

(Necessity of Etching Stopper and Problems Thereof)

The multilayer film 12 reflecting the EUV light must have high reflectivity after completion of the production of the mask. Therefore, it is required to prevent the multilayer film 12 reflecting the EUV light from being damaged during the production process. In particular, during the patterning step, the patterning must be performed without a damage, such as reduction in film thickness and roughening of the surface, given to the multilayer film 12.

In the patterning of the absorber layer 14 absorbing the EUV light, high dimensional accuracy can be obtained by dry-etching. However, it is impossible to perform the etching without damaging an underlayer of the absorber layer 14 absorbing the EUV light. In view of the above, it is necessary to deposit the etching stopper 23 as the intermediate layer between the multilayer film 12 and the EUV absorber layer 14.

As the etching stopper 23, use is generally made of an $SiO_2$ film having a film thickness not smaller than several hundreds of angstroms. This film sufficiently serves as the stopper in the dry-etching with a $Cl_2$ gas. However, If the $SiO_2$ film remaining in a patternless area is not perfectly removed upon completion of the patterning step, the reflectivity of the multilayer film 12 reflecting the EUV light will be considerably lowered.

It is therefore necessary to perfectly remove the $SiO_2$ film. However, if the dry-etching is carried out to remove the $SiO_2$ film, the Si film as the uppermost layer of the multilayer film 12 reflecting the EUV light is inevitably etched. This also results in low reflectivity. For this reason, the $SiO_2$ film must be removed by wet-etching with HF solution or the like. The wet-etching with the HF solution or the like is effective because no damage is given to the Si film as the underlayer of the $SiO_2$ film. On the other hand, the wet etching with the HF solution has isotropic etchability so that the pattern is laterally eroded and may possibly be peeled off.

In addition, the $SiO_2$ film having a film thickness not smaller than several hundreds angstroms has high surface roughness as well as high compression stress. Furthermore, abnormal discharge readily occurs during deposition of the $SiO_2$ film by sputtering. It is therefore difficult to achieve a low fault rate required for the EUV mask.

(Second Existing Technique)

Japanese Unexamined Patent Publication (A) No. H08-213303 discloses a reflection type X-ray mask in which an intermediate layer containing Cr or Ti as a major component and having an etching ratio of 5 or more with respect to an absorber layer is formed on a multilayer film. According to this publication, the intermediate layer serves as an etching stopper as well as a protection layer for the multilayer reflection film when the pattern is formed on the absorber layer by etching. Alter the pattern is formed on the absorber layer, the intermediate layer positioned in a reflection region is removed.

(Third Existing Technique)

Japanese Unexamined Patent Publication (A) No. H07-333829 discloses a technique in which an intermediate layer is deposited between an absorber layer and a multilayer film by the use of a material (for example, Cr, Al, and Ni) having low absorption for exposure light, such as an X-ray and extreme ultra violet light, and having an etching rate slower than that of the absorber layer. Thus, it is possible to prevent decrease in reflectivity of the multilayer film without removing the intermediate film after the pattern is formed on the absorber layer by etching.

However, each of the intermediate films ($SiO_2$ Cr, Al, Ni, and so on) described in conjunction with the first to the third existing techniques has a surface which is insufficient in smoothness and is roughened. Therefore, the absorber layer deposited on the intermediate layer having such a roughened surface also has a surface which is equally or more roughened as compared with the intermediate layer. As a result, the absorber pattern inevitably has a rough edge, giving an adverse affect to the transfer accuracy of the reflection type mask for EUV exposure.

Further, it is found out by the present inventors that, in the reflection type mask for EUV exposure as described in conjunction with the third existing technique among the first through the third existing techniques, i.e., in the reflection type mask having a structure in which the intermediate layer is left after formation of the pattern by etching, the roughened surface of the intermediate layer has a serious influence upon the transfer accuracy of the reflection type mask for EUV exposure.

Specifically, when a material (for example, Cr, Al, and Ni) having high surface roughness is employed as the intermediate layer left in the reflection region, the exposure light is scattered on the surface of the intermediate layer, resulting in decrease of the reflectivity.

Further, when the material of the intermediate layer, like Cr, Al, and Ni, is not resistant to a chemical agent used in a step of cleaning the reflection type mask for EUV exposure, degradation of the intermediate layer or separation of the pattern is caused to occur so that the reflection of the exposure light becomes non-uniform.

Moreover, when the material of the intermediate layer has a high film stress, the reflection surface of the reflection type mask for EUV exposure may be warped to thereby degrade the transfer accuracy of the pattern.

In the past, no consideration has been made about these problems, and no materials for solving these problems have not been found.

SUMMARY OF THE INVENTION

It is therefore an object of this invention to provide a reflection type mask blank for EUV exposure which is capable of forming a pattern with high accuracy and a reflection type mask for EUV exposure with high reflectivity as well as a method of producing the same.

It is another object of this invention to provide a method of producing a semiconductor device, which is capable of transferring a pattern on a semiconductor substrate by the use of the above-mentioned reflection type mask for EUV exposure having high reflectivity.

Other objects of this invention will become clear as the description proceeds.

According to a first aspect of this invention, there is provided a reflection type mask blank for EUV exposure comprising a substrate, a multilayer film formed on the substrate to reflect EUV light, an intermediate layer formed on the multilayer film, an absorber layer formed on the intermediate layer to absorb the EUV light, the intermediate layer being formed by a material containing Cr and at least one selected from the group consisting of N, O, and C.

According to a second aspect of this invention, the absorber layer in the mask blank of the first aspect of this invention is formed by a material containing Ta.

According to a third aspect of this invention, there is provided a reflection type mask blank for EUV exposure comprising a substrate, a multilayer film formed on the substrate to reflect EUV light, an intermediate layer formed on the multilayer film, an absorber layer provided with a pattern and formed on the intermediate layer to absorb the EUV light, the intermediate layer being formed by a material containing Cr and at least one element selected from the group consisting of N, O, and C.

According to a fourth aspect of this invention, the absorber layer in the mask blank of the third aspect of this invention is formed by a material containing Ta.

According to a fifth aspect of this invention, there is provided a method of producing a reflection type mask for EUV exposure by the use of the reflection type mask blank for EUV exposure of the first or the second aspect of this invention.

According to a sixth aspect of this invention, there is provided a method of producing a semiconductor device, the method comprising the step of transferring a pattern on a semiconductor substrate by the use of the reflection type mask for EUV exposure of the third or the fourth aspect of this invention.

DESCRIPTION OF PREFERRED EMBODIMENT

Figure 1:
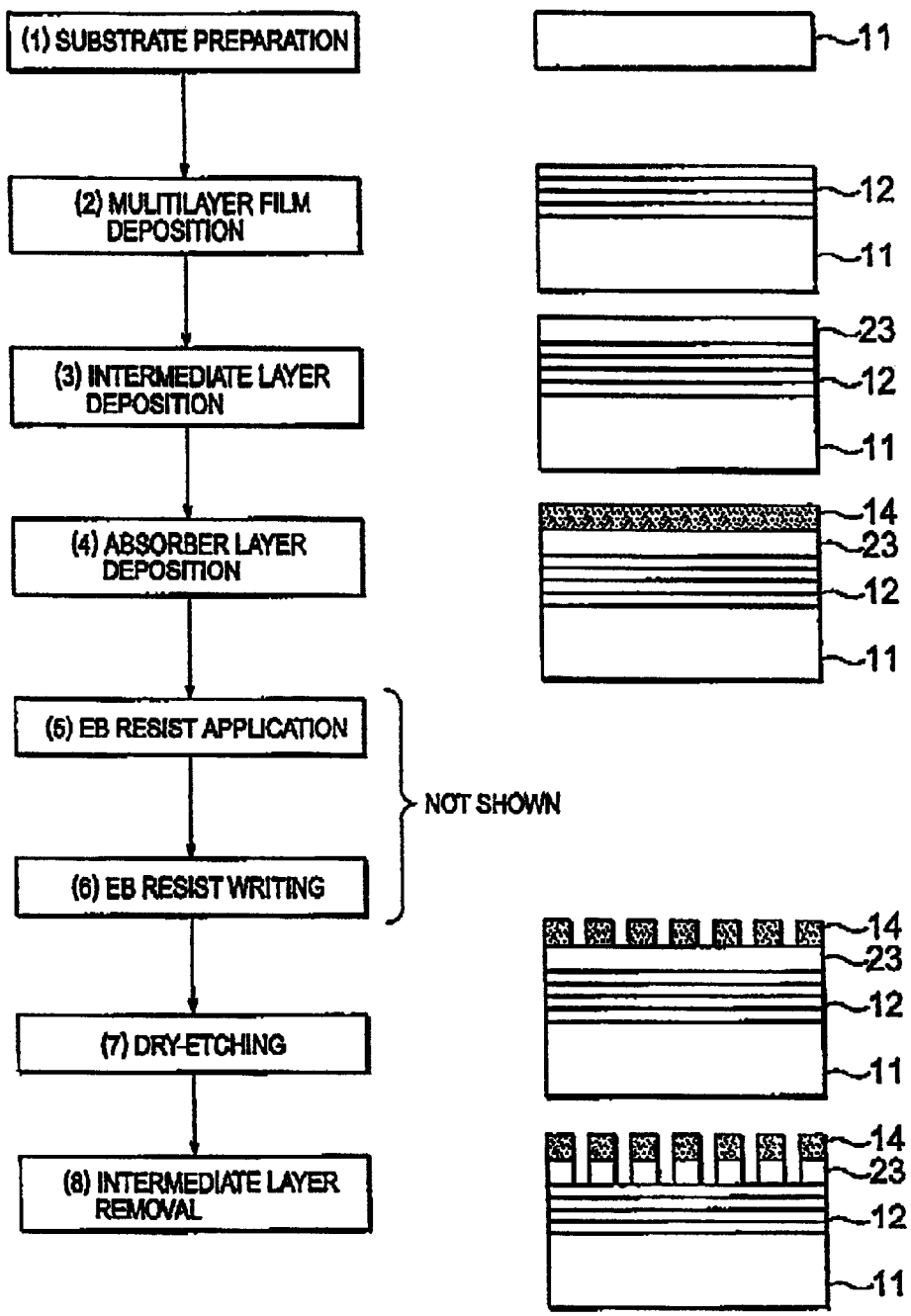
FIG. 1 is a flow diagram showing a production process of an EUV mask according to a firs existing technique.

Now, description will be made of an embodiment of this invention with reference to the drawing.

In the following description, a reflection type mask for EUV exposure will be abbreviated to an EUV mask while a reflection type mask blank for EUV exposure will be abbreviated to an EUV mask blank.

At first referring to FIG. 2, description will be made about a production process of the EUV mask and pattern transfer onto a semiconductor substrate using the EUV mask according to an embodiment of this invention. Herein, the same reference numerals are affixed to corresponding portions in FIGS. 1 and 2.

The production process of the EUV mask and the pattern transfer onto the semiconductor substrate using the EUV mask comprises (1) a substrate preparation step of preparing a substrate, (2) a deposition step of depositing a multilayer film onto the substrate, (3) a deposition step of depositing an intermediate layer, (4) a deposition step of depositing an absorber layer, (5) an EB resist application step of applying an EB resist, (6) an EB resist writing step, (7) a dry-etching step, (8) a removing step of removing the intermediate layer, and (9) a pattern transfer step of transferring a pattern onto a semiconductor substrate using the EUV mask.

(1) Substrate Preparation Step:

Preferably, the substrate 11 has a low coefficient of thermal expansion and is superior in smoothness, flatness, and resistance to a cleaning liquid used for cleaning the EUV mask. Generally, use is made of a glass having a low coefficient of thermal expansion, such as a $SiO_2$—$TiO_2$ based glass.

However, the substrate 11 is not restricted to such a glass but may be made of other various materials, such as a crystalized glass with β quartz solid solution precipitated therein, a silica glass, silicon, and metal. As an example of a metal substrate, invar alloy (Fe—Ni based alloy) can be used.

The substrate 11 preferably has a smooth surface of 0.2 nmRms (Mean Square Roughness) or less as well as flatness of 100 nm or less to realize high reflectivity and high transfer accuracy.

(2) Multilayer Film Deposition Step:

A multilayer film made of Mo and Si is used as the multilayer film 12 in many cases. Alternatively, use can be made of a Ru/Si periodic multilayer film, a Mo/Be periodic multilayer film, a Mo compound/Si compound periodic multilayer film, a Si/Nb periodic multilayer film, a Si/Mo/Ru periodic multilayer film, a Si/Mo/Ru/Mo periodic multilayer film, and a Si/Ru/Mo/Ru periodic multilayer film as a material with high reflectivity in a specific wavelength region. Herein, an optimum film thickness depends upon the material.

In case of the multilayer film containing Mo and Si, deposition is carried out by DC magnetron sputtering. At first, a Si film is deposited in an Ar gas atmosphere using a Si target. Thereafter, a Mo film is deposited in an Ar gas atmosphere using a Mo target. The above-mentioned deposition of the single Si film and the single Mo film is defined as one period. By repeating the deposition, lamination of 30–60 periods, preferably 40 periods, is carried out. Finally, another Si film is deposited.

(3) Intermediate Layer Deposition Step:

In order to achieve the above-mentioned object, the present inventors have studied enthusiastically to finally find out the following conditions to be satisfied by a material of the etching stopper 13 as the intermediate layer between the multilayer film 12 and the EUV absorber layer 14.

First, the material must have high etching selectivity of 10 or more with respect to the EUV absorber layer 14 containing Ta as a major component.

Second, the material must achieve sufficiently low surface roughness of the etching stopper 13 obtained after deposition.

Third, the material must have resistance against a chemical agent, such as hot strong sulfuric acid/hydrogen peroxide solution and ammonia/hydrogen peroxide solution, used as a cleaning liquid in the production process of the EUV mask.

Fourth, the material must achieve low film stress of the etching stopper 13 obtained after deposition.

Thus, it is required that the material of the etching stopper 13 satisfies the afore-mentioned conditions.

As the material satisfying the above-mentioned conditions, the present inventors have found a material containing Cr and at least one element selected from the group consisting of N, O, and C.

Specifically, the material containing Cr and at least one element selected from the group consisting of N, O, and C is used as a deposition material for the intermediate layer. Thus, the EUV mask capable of forming a high-accuracy pattern can be obtained.

In case where the element N is selected and therefore the material represented by $Cr_{1-x}N_x$ used, acid resistance is particularly enhanced. Accordingly, it is possible to improve the durability against the cleaning liquid in the production process of the EUV mask.

Further, in case where the element O is selected and therefore the material represented by $Cr_{1-x}O_x$ is used, controllability of low stress during deposition is particularly improved.

Moreover, in case where the element C is selected and therefore the material represented by $Cr_{1-x}C_x$ is used, dry-etching resistance is particularly improved.

As will be explained later, in case where the mask is used with the intermediate layer left on a reflection region (i.e., an area where the pattern of the absorber layer is not formed) of the mask, the exposure light passes through the intermediate layer. In view of the above, it is preferable that the material of the intermediate layer has an absorption coefficient as small as possible in order to suppress reduction in reflectivity.

Specifically, it is desired that the material has an absorption coefficient not greater than 0.05, preferably, not greater than 0.035, for the exposure light (having the wavelength of 13 nm within the EUV region).

On the other hand, in case where the pattern of the absorber layer is modified by the use of the FIB (Focused Ion Beam), the intermediate layer is required to be relatively thick, for example, as thick as 30 nm or more in order to prevent the multilayer film from being damaged. In this event, the material preferably has a relatively high absorption coefficient because the intermediate layer on the reflection region of the mask must be removed.

In the reflection type mask, the exposure light is generally incident not in a direction perpendicular to the mask but at an incident angle of several degrees with respect to the mask. Consequently, the shade of the pattern itself is inevitably produced so that the reflected image is not focused. Such a problem of the shade of the pattern itself becomes more and more serious as the pattern itself is thicker. In addition, in case where the pattern itself is thick, an etching time upon forming the pattern also becomes long, thus deteriorating the shape accuracy of the pattern. As a result, the pattern transferred onto the semiconductor substrate is degraded in shape accuracy. Therefore, the mask pattern itself is preferably as thin as possible. This means that the total film thickness of the absorber layer and the intermediate layer must be reduced because an absorber pattern region of the mask has a laminate structure comprising the absorber layer and the intermediate layer.

To this end, not only the absorber layer but also the intermediate layer are given the function of absorbing the exposure light so that a combination of the absorber layer and the intermediate layer sufficiently absorbs the exposure light. Based on the above-mentioned concept, the film thickness of the intermediate layer and the absorber layer will be designed suitably.

Further, if the material having a relatively high absorption coefficient is employed for the intermediate layer, the intermediate layer can be reduced in thickness. On the other hand, if the intermediate layer is not changed in film thickness, the absorber layer can be reduced in thickness because an absorption ability of the intermediate layer is improved.

As a result, the total film thickness of the intermediate layer and the absorber layer can be reduced to thereby suppress the problem of shade of the pattern. Preferably, the total film thickness of the intermediate layer and the absorber layer is not greater than 100 nm.

As described above, in case where the intermediate layer in the reflection region of the mask is removed, the problem of the shade of the pattern can be suppressed by employing the material having a relatively high absorption coefficient for the intermediate layer. From such a viewpoint, it is preferable that, in case where the intermediate layer can be removed, the material has an absorption coefficient not smaller than 0.030 for the exposure light.

Hereinafter, specific examples of the preferred intermediate layer will be explained.

(In case of $Cr_{1-x}N_x$)

The intermediate layer is deposited, for example, by the DC magnetron sputtering using a Cr target in a mixed gas atmosphere containing Ar and 10–60% $N_2$ added thereto.

Preferably, the film thickness falls within the range between 4 and 10 nm. If the intermediate layer will later be removed, the film thickness desirably falls within the range between 3 and 50 nm, more preferably between 4 and 40 nm.

However, if the above-mentioned problem of the shade of the pattern is taken into consideration, it is preferable that the total film thickness of the intermediate layer and the absorber layer falls within the range not greater than 100 nm, more preferably between 30 and 50 nm.

In the meantime, the value x in $Cr_{1-x}N_x$ preferably falls within the range between 0.05 and 0.5, both inclusive (namely, $0.05 \leq x \leq 0.5$), more preferably between 0.07 and 0.4, both inclusive (namely, $0.07 \leq x \leq 0.4$). The value x smaller than 0.05 is not preferable because the stress becomes high and the surface roughness is large. The value x higher than 0.5 is not desirable from the viewpoint of the etching selectivity.

Further, if the content of N is increased, the surface roughness as well as the absorption coefficient tend to be decreased or lowered. In case where the intermediate layer is not removed, it is desirable to reduce the absorption coefficient of the intermediate layer so as to suppress the reduction of the reflectvity.

However, from a different viewpoint, it is advantageous that the intermediate layer has a high absorption coefficient in order to reduce the total film thickness of the intermediate layer and the absorber layer for the purpose of suppressing the problem of the shade of the pattern as described above. Therefore, in case where the intermediate layer can be removed, the content of N is preferably decreased to a lower level as far as the desired surface roughness is assured. For this reason, in case where the intermediate layer is removed, the content of N preferably falls within the range between 5 and 20% (the value x falls within the range between 0.05 and 0.2), more preferably between 5 and 15% (the value x falls within the range between 0.05 and 0.15).

(In case of $Cr_{1-x}O_x$)

The intermediate layer is deposited, for example, by the DC magnetron sputtering using a Cr target in a mixed gas atmosphere containing Ar and oxygen added thereto. Preferably, the film thickness falls within the range between 4 and 12 nm. If the intermediate layer will later be removed, the film thickness desirably falls within the range between 3 and 50 nm, more desirably between 4 and 30 nm. In the meantime, the value x desirably falls within the range between 0.05 and 0.6, both inclusive (namely, $0.05 \leq x \leq 0.6$).

(In case of $Cr_{1-x}C_x$)

The intermediate layer is deposited, for example, by the DC magnetron sputtering using a Cr target in a mixed gas atmosphere containing Ar and methane gas added thereto. Preferably, the film thickness falls within the range between 4 and 10 nm. If the intermediate layer will later be removed, the film thickness desirably falls within the range between 3 and 50 nm, more desirably between 4 and 30 nm. On the other hand, the value x preferably falls within the range between 0.05 and 0.4, both inclusive (namely, $0.05 \leq x \leq 0.4$).

(In case of $Cr_{1-x-y}N_xC_y$)

The intermediate layer is deposited, for example, by the DC magnetron sputtering using a Cr target in a mixed gas atmosphere containing Ar with nitrogen and methane gas added thereto. Preferably, the film thickness falls within the range between 4 and 10 nm. If the intermediate layer will later be removed, the film thickness desirably falls within the range between 3 and 50 nm, more desirably between 4 and 30 nm. In the meantime, the value x preferably falls within the range between 0.05 and 0.45, both inclusive (namely, $0.05 \leq x \leq 0.4$) while the value y desirably falls within the range between 0.01 and 0.3, both inclusive (namely, $0.01 \leq y \leq 0.3$).

(In case of $Cr_{1-x-y-z}N_xO_yC_z$)

The intermediate layer is deposited, for example, by the DC magnetron sputtering using a Cr target in a mixed gas atmosphere containing Ar and nitrogen, oxygen, and methane gas added thereto. Preferably, the film thickness falls within the range between 4 and 12 nm. If the intermediate layer will later be removed, the film thickness desirably falls within the range between 3 and 50 nm, more desirably between 4 and 30 nm.

In the meantime, the value x preferably falls within the range between 0.05 and 0.40, both inclusive (namely, $0.05 \leq x \leq 0.40$), the value y desirably falls within the range between 0.02 and 0.3, both inclusive (namely, $0.02 \leq y \leq 0.3$), and the value z preferably falls within the range between 0.01 and 0.2, both inclusive (namely, $0.01 \leq z \leq 0.2$).

In the embodiment which will presently be described, $Cr_{1-x}N_x$ is employed as the intermediate layer by way of example. With such a structure, the resultant intermediate layer has the absorption coefficient within the range between 0.032 and 0.038 with respect to the exposure light having the wavelength of 13.4 nm.

(4) Absorber Layer Deposition Step:

As the material of the EUV absorber layer 14, it is preferable to use (1) a material containing Ta as a major component, (2) a material containing Ta as a major component and at least B, (3) a material having an amorphous structure and containing Ta as a major component, (4) a material having an amorphous structure and containing Ta as a major component and at least B (for example, a material having the amorphous structure and containing about 25% B represented by $Ta_4B$), and (5) a material containing Ta, B, and N (for example, a material having the amorphous structure and containing Ta as a major component, about 15% B, and about 10% N).

However, the material of the EUV absorber layer 14 is not restricted to the above-mentioned materials but may be other various materials, such as TaSi, TaSiN, TaGe, TaGeN, WN, Cr, and TiN.

In case where a TaB compound thin film is used as the material of the EUV absorber layer 14, it is preferable that a $Ta_4B$ film is deposited by the DC magnetron sputtering using a $Ta_4B$ target in an Ar gas atmosphere. By this step, the EUV mask blank is obtained.

(5) EB Resist Application Step:

The EUV mask can be produced by forming the pattern on the absorber layer 14 of the EUV mask blank thus obtained. The EB resist is applied on the EUV mask blank obtained in the step (5) and is baked at 200° C.

(6) EB Resist Writing Step:

By the use of an EB writing machine of 30 KeV, the resist pattern is formed on the EUV mask blank with the EB resist applied thereto.

(7) Dry-Etching Step:

By the use of an ICP-RIE apparatus and the resist pattern as the mask, the EUV absorber layer 14 is dry-etched with chlorine at a substrate temperature of 20° C. to thereby form the pattern on the absorber layer 14. During this step, a $Cr_{1-x}N_x$ film as an underlayer is slightly etched to be reduced in film thickness down to a range between 3 and 6 nm. Further, the resist remaining on the pattern of the absorber layer 14 is removed by the use of hot strong sulfuric acid at 100° C.

(8) Intermediate Layer Removing Step:

The etching stopper 13 remaining on the EUV reflection surface is removed by wet-etching with $(NH_4Ce)(NO_3)_6 + HClO_4 + H_2O$. Then, the EUV mask is obtained.

However, as described in the step (3), the etching stopper 13 containing Cr and at least one element selected from the group consisting of N, O, and C has the absorption coefficient not greater than 0.05 for the light having the wavelength (13 nm) within the EUV region. In addition, in the etching stopper 13, the surface roughness upon deposition is sufficiently small and the film stress after deposition is small.

Because of the above-mentioned advantages of the etching stopper 13, even if the etching stopper is left on the EUV reflection surface, a sufficiently excellent EUV mask can be obtained.

In this case, the intermediate layer is preferably formed by the material having a lower absorption coefficient in order to suppress the reduction in reflectivity as small as possible.

Such embodiment leaving the intermediate layer is desirable from the viewpoint of the man-hour because the above-mentioned step (8) can be omitted.

Figure 3:
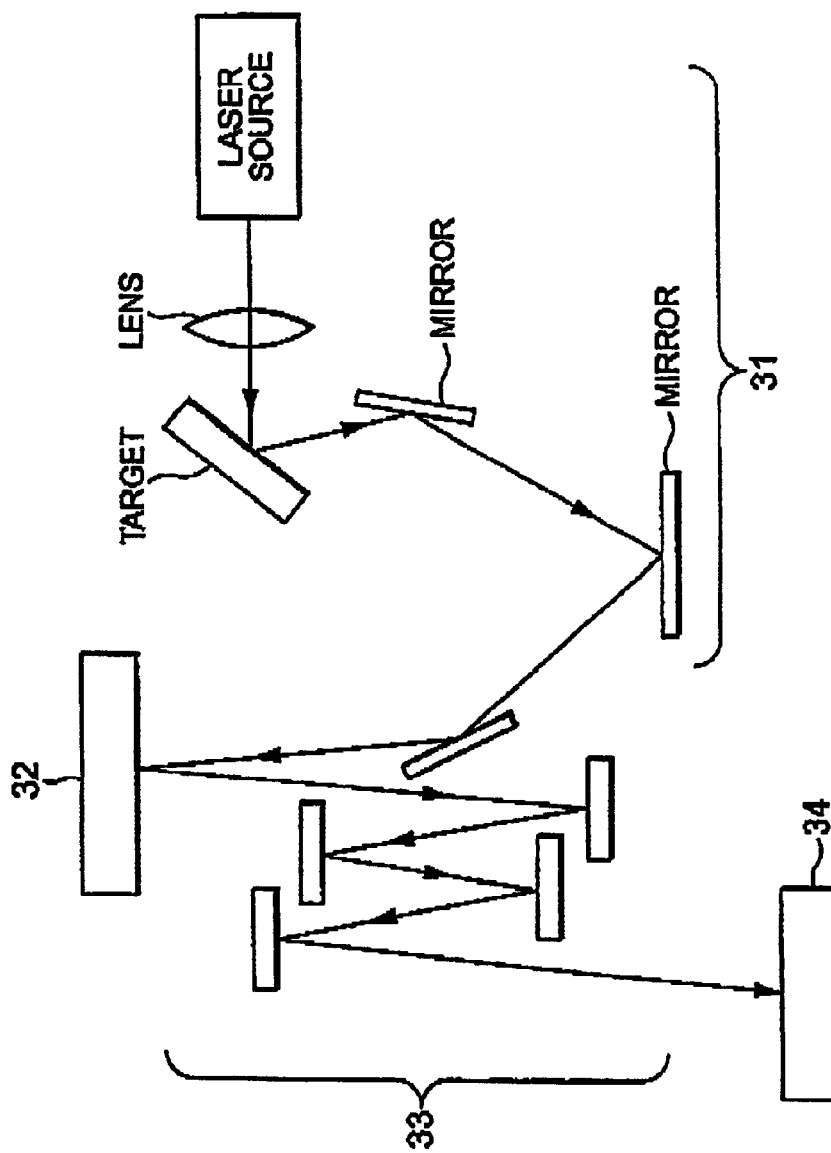
FIG. 3 is a schematic diagram showing a pattern transfer apparatus for carrying out pattern transfer by the use of the EUV mask according to the embodiment of this invention.

(9) Pattern Transfer onto Semiconductor Substrate Using EUV Mask:

Referring to FIG. 3, description will be made about the pattern transfer onto the semiconductor substrate using the EUV mask.

A pattern transfer apparatus comprises a laser plasma X-ray source 31, an EUV mask 32, and a reducing optical system 33.

With this structure, the EUV light (soft X-ray) produced by the laser plasma X-ray source 31 is incident to the EUV mask 32 and reflected by the EUV mask 32 to be transferred onto a Si wafer substrate 34 via the reducing optical system 33.

As the reducing optical system 33, an X-ray reflection mirror can be used. The pattern reflected by the EUV mask 32 is typically reduced to about ¼ via the reducing optical system 33. For example, the transfer of the pattern onto the Si wafer substrate 34 can be performed by exposing the pattern on the resist layer formed on the Si wafer substrate 34 and developing the exposed pattern.

In case where the wavelength band of 13–14 nm is employed as the exposure wavelength, the transfer is generally carried out so that an optical path is positioned in vacuum. As a material of the multilayer film within the wavelength band of 13–14 nm, use can be made of a Mo/Si multilayer film having a peak wavelength in the above-mentioned wavelength band.

Thus, by forming the pattern on the Si wafer substrate using the EUV mask obtained in the embodiment, a semiconductor device such as a LSI with high integration can be manufactured.

FIRST EXAMPLE

Figure 2:
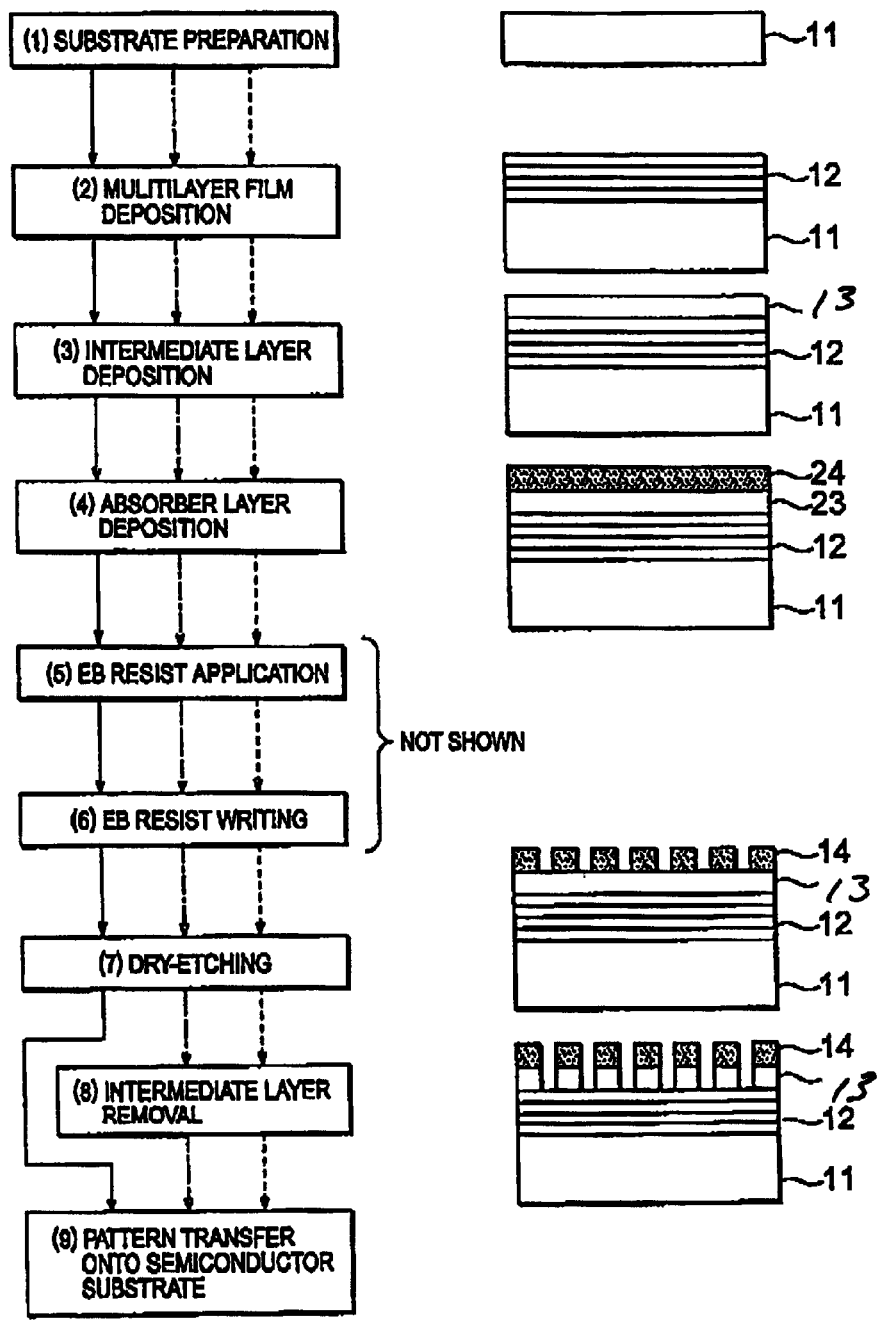
FIG. 2 is a flow diagram showing a production process of an EUV mask according to an embodiment of this invention.

Referring to FIG. 2, description will be made about a first example of the production process of the EUV mask blank as well as the EUV mask. In FIG. 2, the production process according to the first example is depicted by a solid line.

As the glass substrate 11, a low-expansion $SiO_2$—$TiO_2$ based glass substrate having an outer dimension of 6-inch square and a thickness of 6.3 mm was used. The glass substrate 11 was subjected to mechanical polishing to have a smooth surface of 0.12 nmRms in 10 μm square and a flatness of 100 nm or less in 142 mm square.

Mo and Si were laminated as the multilayer film 12. By the DC magnetron sputtering, a Si film was at first deposited to 4.2 nm using a Si target under an Ar gas pressure of 0.1 Pa. Thereafter, a Mo film was deposited to 2.8 nm using a Mo target under an Ar gas pressure of 0.1 Pa. The above-mentioned deposition of the single Si film and the single Mo film is defined as one period. By repeating the deposition, lamination of 40 periods was performed. Finally, another Si film was deposited to 4 nm. Herein, the multilayer film had the surface roughness equal to 0.12 nmRms.

Subsequently, by the DC magnetron sputtering, the etching stopper 13 comprising the $Cr_{1-x}N_x$ film was deposited on the multilayer film 12 to a thickness of 6 nm by using a Cr target and a sputter gas containing Ar and 20% nitrogen added thereto. Thus, the etching stopper 13 was formed as the intermediate layer.

In the $Cr_{1-x}N_x$ film thus deposited, the value x was equal to 0.25. An absorption coefficient at the wavelength of 13.4 nm was equal to 0.035. The film stress was equal to +40 MPa in terms of the film thickness of 100 nm. Further, the surface roughness was equal to 0.23 Rms.

On the etching stopper 13 comprising the $Cr_{1-x}N_x$ film, a film containing Ta and B was deposited as the EUV absorber layer 14 to a thickness of 0.1 μm by the use of the DC magnetron sputtering. At this time, the stress of the EUV absorber layer 14 was suppressed to +50 MPa by controlling the sputtering condition.

Next, by using the EUV mask blank, the EUV mask with a pattern for a 16 Gbit-DRAM having a design rule of 0.07 μm was produced in the following manner.

At first, the above-mentioned EUV mask blank was coated with an EB resist. Then, a resist pattern was formed by EB writing and development. Using the resist pattern as the mask, the EUV absorber layer 14 was dry-etched with chlorine so that the absorber pattern was formed on the EUV mask blank. Thus, the EUV mask was obtained.

During the etching, the etching stopper 13 comprising the $Cr_{1-x}N_x$ film as the intermediate layer under the absorber layer 14 was exposed to chlorine plasma by over-etching. As a result, the etching stopper 13 was reduced in film thickness to 4 nm.

Herein, the reflectivity was measured by the use of the EUV light having a wavelength of 13.4 nm and an incident angle of 2 degrees without removing the etching stopper 13. As a result, an excellent reflection characteristic within the range of 55%±0.5% was observed in a region of 130 mm square.

The pattern of the absorber layer 14 of the EUV mask obtained by the aforementioned process had a sufficiently small edge roughness. Further, exposure transfer was performed onto the semiconductor substrate by the EUV light using the pattern transfer apparatus, as illustrated in FIG. 3. As a result, it was confirmed that the EUV mask had a sufficient exposure characteristic as well as an accuracy of 16 nm or less as required in the design rule of 70 nm.

SECOND EXAMPLE

Referring to FIG. 2, description will be made about a second example of the production process of the EUV mask blank and the EUV mask. In FIG. 2, the production process according to the second example is depicted by a dot-and-dash line.

As the glass substrate 11, a low-expansion $SiO_2$—$TiO_2$ based glass substrate having an outer dimension of 6-inch square and a thickness of 6.3 mm was used. The glass substrate 11 was subjected to mechanical polishing to have a smooth surface of 0.12 nmRms as well as a flatness of 100 nm or less.

Mo and Si were laminated as the multilayer film 12. By the DC magnetron sputtering, a Si film was at first deposited to 4.2 nm using a Si target under an Ar gas pressure of 0.1 Pa. Thereafter, a Mo film was deposited to 2.8 nm using a Mo target under an Ar gas pressure of 0.1 Pa. The above-mentioned deposition of the single Si film and the single Mo film is defined as one period. By repeating the deposition, lamination of 40 periods was performed. Finally, another Si film was deposited to 4 nm. Herein, the surface roughness on the multilayer film was equal to 0.12 nmRms.

Subsequently, by the DC magnetron sputtering, the etching stopper 13 as the intermediate layer comprising the $Cr_{1-x}N_x$ film was deposited on the multilayer film 12 to a thickness of 15 nm by using a Cr target and a sputter gas containing Ar and 30% nitrogen added thereto.

In the $Cr_{1-x}N_x$ film thus deposited, the value x was equal to 0.4. An absorption coefficient at the wavelength of 13.4 nm was equal to 0.033. The film stress was equal to +30 MPa in terms of the film thickness of 100 nm. In this event, the surface roughness on the $Cr_{1-x}N_x$ film was equal to 0.14 nmRms.

On the etching stopper 13 comprising the $Cr_{1-x}N_x$ film, a film containing Ta and B was deposited as the EUV absorber layer 14 to a thickness of 100 nm by the use of the DC magnetron sputtering. Thus, the EUV mask blank was obtained.

In this case, the stress of the TaB film was equal to +30 MPa in terms of the film thickness of 100 nm. Further, the surface roughness on the TaB film was equal to 0.18 nmRms.

Next, by using the EUV mask blank, the EUV mask with a pattern for a 16 Gbit-DRAM having a design rule of 70 nm was produced in the following manner.

At first, the above-mentioned EUV mask blank was coated with an EB resist. Then, a resist pattern was formed by EB writing. Using the resist pattern as the mask, the EUV absorber layer 14 was dry-etched with chlorine so that the absorber pattern was formed on the EUV mask blank. Furthermore, the $Cr_{1-x}N_x$ film was removed by wet-etching. Thus, the EUV mask was obtained. For the EUV mask thus obtained, the reflectivity was measured by the use of the EUV light having a wavelength of 13.4 nm and an incident angle of 2 degrees. As a result, an excellent reflection characteristic of 65% was obtained.

The pattern of the absorber layer 14 of the EUV mask had a sufficiently low edge roughness. Further, exposure transfer was performed onto the semiconductor substrate by the EUV light using the pattern transfer apparatus, as illustrated in FIG. 3. As a result, it was confirmed that the EUV mask had a sufficient exposure characteristic and an accuracy of 16 nm or less as required in the design rule of 70 nm.

THIRD EXAMPLE

In the third example, the EUV mask blank and the EUV mask were produced in the manner similar to the first example except that the $Cr_{1-x}C_x$ film (x=0.2) was employed as the etching stopper 13.

It is noted here that the intermediate layer was deposited by the DC magnetron sputtering in an atmosphere of Ar (90%) and methane gas (10%) and had the film thickness of 50 nm.

As a result, the intermediate layer thus deposited had the absorption coefficient of 0.034 for the light having the wavelength of 13.4. Further, the intermediate layer had the stress of +20 Mpa in terms of the film thickness of 100 nm. In this case, the intermediate layer had the surface roughness of 0.25 nmRms.

The etching stopper 13 after etching was reduced in thickness to 40 nm by the over-etching during formation of the absorber pattern.

Herein, the reflectivity was measured by the use of the EUV light having a wavelength of 13.4 nm and an incident angle of 2 degrees without removing the etching stopper 13. As a result, an excellent reflection characteristic within the range of 57%±0.5% was observed in a region of 130 mm square.

FOURTH EXAMPLE

In the manner similar to the second example, the multilayer film 12 containing Mo and Si was formed on the glass substrate 11. Subsequently, by the DC magnetron sputtering, the etching stopper 13 as the intermediate layer comprising the $Cr_{1-x}N_x$ film was deposited on the multilayer film 12 to a thickness of 40 nm by using the Cr target and a sputter gas containing Ar and nitrogen added thereto.

In this case, the value x was equal to 0.08. Further, the $Cr_{1-x}N_x$ film had the absorption coefficient equal to 0.036 for the light having the wavelength of 13.4 nm. The surface roughness on the intermediate layer was equal to 0.28 nmRms.

On the etching stopper 13 comprising the $Cr_{1-x}N_x$ film, a film containing Ta and B was deposited as the absorber layer 14 to a thickness of 55 nm by the use of the DC magnetron sputtering.

Herein, the total film thickness of the intermediate layer and the absorber layer was equal to 95 nm. The ratio of B in the TaB film was 15 at %, and the surface roughness on the TaB film was 0.3 nmRms. Further, the TaB film had the absorption coefficient of 0.039 for the light having the wavelength of 13.4 nm. Thus, the EUV mask blank according to this example was obtained.

Next, by using the EUV mask blank, the EUV mask with a pattern for a 16 Gbit-DRAM having a design rule of 70 nm was produced in the following manner.

At first, the above-mentioned EUV mask blank was coated with an EB resist. Then, a resist pattern was formed by EB writing. Using the resist pattern as the mask, the EUV absorber layer 14 was dry-etched with chlorine to thereby form the absorber pattern.

The resist remaining on the absorber layer was removed by hot strong sulfuric acid. Further, the $Cr_{1-x}N_x$ film on the reflection region of the mask was removed by dry-etching with chlorine and oxygen. Thus, the EUV mask was obtained.

For the EUV mask thus obtained, the reflectivity was measured by the use of the EUV light having a wavelength of 13.4 nm and an incident angle of 2 degrees. As a result, an excellent reflectivity of 65% could be obtained.

In the EUV mask thus obtained, the edge roughness of the absorber layer 14 was sufficiently small. In addition, the total film thickness of the absorber layer and the intermediate layer, namely, the height of the absorber pattern could be reduced to 95 nm. It is therefore possible to suppress the problem that the pattern is not focused upon the exposure. It was confirmed that the EUV mask had excellent exposure characteristic in the pattern transfer onto the semiconductor substrate as illustrated in FIG. 3. Moreover, the EUV mask had the accuracy of 16 nm or less as required in the design rule of 70 nm.

COMPARATIVE EXAMPLE

Referring to FIG. 2, description will be made about a comparative example of the production of the EUV mask blank and the EUV mask. In FIG. 2, the production process according to the comparative example is depicted by a dotted line.

As the glass substrate 11, a low-expansion $SiO_2$—$TiO_2$ based glass substrate having an outer dimension of 6-inch square and a thickness of 6.3 mm was used. The glass substrate 11 was subjected to mechanical polishing to have a smooth surface of 0.12 nmRms as well as a flatness of 100 nm or less.

Mo and Si were laminated as the multilayer film 12. By the DC magnetron sputtering, a Si film was at first deposited to 4.2 nm using a Si target under an Ar gas pressure of 0.1 Pa. Thereafter, a Mo film was deposited to 2.8 nm using a Mo target under an Ar gas pressure of 0.1 Pa. The above-mentioned deposition of the single Si film and the single Mo film is defined as one period. By repeating the deposition, lamination of 40 periods was performed. Finally, another Si film was deposited to 4 nm. Herein, the multilayer film had the surface roughness equal to 0.12 nmRms.

Subsequently, by the DC magnetron sputtering, a Cr film as the etching stopper 13 was deposited on the multilayer film 13 to a thickness of 15 nm by using a Cr target and an Ar gas as a sputter gas.

In this case, the Cr film had an absorption coefficient of 0.039 at the wavelength of 13.4 nm as well as the film stress of +500 MPa in terms of the film thickness of 100 nm. Thus, a high-tensile stress was exhibited. Herein, the surface roughness on the Cr film was equal to 0.29 nmRms.

Subsequently, a film containing Ta and B as the EUV absorber layer 14 was deposited on the etching stopper 13 to a thickness of 100 nm by the use of the DC magnetron sputtering. Thus, the EUV mask blank was obtained.

In this case, the stress of the Cr film as the EUV absorber layer 14 was +40 MPa in terms of the film thickness of 100 nm. Further, the surface roughness on the EUV absorber layer 14 was 0.45 nmRms.

Next, by using the EUV mask blank, the EUV mask with a pattern for a 16 Gbit-DRAM having a design rule of 70 nm was produced in the following manner.

At first, the above-mentioned EUV mask blank was coated with an EB resist. Then, a resist pattern was formed by EB writing. Using the resist pattern as the mask, the EUV absorber layer 14 was dry-etched with chlorine to thereby form the absorber pattern on the EUV mask blank. Further, the Cr film was removed by wet-etching, thus obtaining the EUV mask. For the EUV mask thus obtained, the reflectivity was measured by the use of the EUV light having a wavelength of 13.4 nm and an incident angle of 2 degrees. As a result, a reflection characteristic of 65% could be obtained by removing the Cr film.

On the other hand, as regards the positional accuracy of the EUV mask, the distortion as large as 25 nm was observed as a result of the high stress of the Cr film. In addition, the edge roughness was increased by the rough surface of the EUV absorber layer 14 resulting from the surface roughness of the Cr film. The exposure transfer was performed onto the semiconductor substrate as illustrated in FIG. 3 by the use of the pattern transfer apparatus using the EUV light. As a result, it was confirmed that the EUV mask produced by the comparative example could not have sufficient exposure characteristic.

According to this invention, the material containing Cr and at least one element selected from the group consisting of N, O, and C is used as the intermediate layer so as to produce the EUV mask capable of forming the high-accuracy pattern in the production process of the EUV mask. Consequently, the EUV mask having high accuracy as well as high reflectivity can be produced. Furthermore, it is possible to realize a method of producing a semiconductor device, in which the pattern is transferred on the semiconductor substrate by using the above-mentioned EUV mask.

While this invention has thus far been disclosed in conjunction with several embodiments thereof, it will be readily possible for those skilled in the art to put this invention into practice in various other manners.

What is claimed is:

1. A reflection mask blank for EUV exposure, comprising:

a substrate;

a multilayer film formed on the substrate to reflect EUV light;

an intermediate layer formed on the multilayer film; and an absorber layer formed on the intermediate layer to absorb the EUV light;

the intermediate layer being formed by a material containing Cr and at least one element selected from the group consisting of N, O, and C.

2. A mask blank as claimed in claim 1, wherein:

the absorber layer is formed by a material containing Ta.

3. A method of producing a reflection mask for EUV exposure by the use of the reflection mask blank for EUV exposure claimed in claim 1 or 2.

4. A mask blank as claimed in claim 1, wherein:

the intermediate layer is at least one material selected from the group consisting of $Cr_{1-X}N_X$, $Cr_{1-X}O_X$, $Cr_{1-X}C_X$, $Cr_{1-X-Y}N_XC_Y$, and $Cr_{1-X-Y-Z}N_XO_YC_Z$.

5. A mask blank as claimed in claim 1, wherein:

the intermediate layer is $Cr_{1-X}N_X(0.05 \leq X \leq 0.5)$.

6. A reflection mask for EUV exposure, comprising:

a substrate;

a multilayer film formed on the substrate to reflect EUV light;

an intermediate layer formed on the multilayer film;

an absorber layer provided with a pattern and formed on the intermediate layer to absorb the EUV light;

the intermediate layer being formed by a material containing Cr and at least one element selected from the group consisting of N, O, and C.

7. A mask as claimed in claim 6, wherein:

the absorber layer is formed by a material containing Ta.

8. A method of producing a semiconductor device, comprising the steps of:

transferring a pattern on a semiconductor substrate by the use of the reflection mask for EUV exposure claimed in claim 6 or 7.

9. A mask as claimed in claim 6, wherein:

the intermediate layer is at least one material selected from the group consisting of $Cr_{1-X}N_X$, $Cr_{1-X}O_X$, $Cr_{1-X}C_X$, $Cr_{1-X-Y}N_XC_Y$, and $Cr_{1-X-Y-Z}N_XO_YC_Z$.

10. A mask as claimed in claim 6, wherein:

the intermediate layer is $Cr_{1-X}N_X(0.05 \leq X \leq 0.5)$.

11. A mask as claimed in claim 6, wherein:

the intermediate layer is patterned by using the absorber layer as a mask and is $Cr_{1-X}N_X(0.05 \leq X \leq 0.2)$.

* * * * *